United States Patent
Wang et al.

(10) Patent No.: US 12,014,912 B2
(45) Date of Patent: Jun. 18, 2024

(54) APPARATUS AND METHOD FOR PHYSICAL VAPOR DEPOSITION

(71) Applicant: TAIWAN SEMICONDUCTOR MANUFACTURING COMPANY LIMITED, Hsin-Chu (TW)

(72) Inventors: Yu-Young Wang, New Taipei (TW); Wen-Cheng Yang, Hsinchu (TW); Chyi-Tsong Ni, Hsin-Chu (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 199 days.

(21) Appl. No.: 17/308,372

(22) Filed: May 5, 2021

(65) Prior Publication Data
US 2022/0359174 A1   Nov. 10, 2022

(51) Int. Cl.
| | | |
|---|---|---|
| H01J 37/34 | (2006.01) | |
| C23C 14/35 | (2006.01) | |
| H01F 7/20 | (2006.01) | |
| H01F 27/24 | (2006.01) | |
| H01F 27/28 | (2006.01) | |
| H01F 27/32 | (2006.01) | |

(52) U.S. Cl.
CPC .......... *H01J 37/3458* (2013.01); *C23C 14/35* (2013.01); *H01F 7/20* (2013.01); *H01F 27/24* (2013.01); *H01F 27/28* (2013.01); *H01F 27/327* (2013.01); *H01J 37/3405* (2013.01)

(58) Field of Classification Search
CPC ... H01J 37/3458; H01J 37/3405; C23C 14/35; H01F 7/20; H01F 27/24; H01F 27/28; H01F 27/327
See application file for complete search history.

(56) References Cited

U.S. PATENT DOCUMENTS

| | | | | | |
|---|---|---|---|---|---|
| 4,842,703 A | * | 6/1989 | Class | .................. | C23C 14/3407 204/298.18 |
| 9,347,129 B2 | * | 5/2016 | Foo | ........................ | H01F 7/0284 |

FOREIGN PATENT DOCUMENTS

| | | | | | |
|---|---|---|---|---|---|
| DE | 3735162 A | * | 4/1988 | ............. | C23C 14/35 |
| JP | 02008366 A | * | 11/1990 | | |

OTHER PUBLICATIONS

Machine Translation JP02008366A (Year: 1990).*
Machine Translation DE3735162A (Year: 1988).*

* cited by examiner

*Primary Examiner* — Michael A Band
(74) *Attorney, Agent, or Firm* — Cooper Legal Group, LLC

(57) ABSTRACT

An apparatus and method for physical vapor deposition includes a magnetron having a plurality of electromagnets disposed between a base and a magnetic conductive plate. The magnetron includes a plurality of individually controlled electromagnets between a base and an electromagnetic plate. The magnetron controls the polarity and strength of current supplied to the respective electromagnets to generate magnetic fields that confine electrons to areas near a target material within the deposition chamber.

20 Claims, 11 Drawing Sheets

APPARATUS AND METHOD FOR PHYSICAL VAPOR DEPOSITION

BACKGROUND

Physical vapor deposition (PVD) is a target material deposition process performed in a deposition chamber. The target material is bombarded by ions originating from a process gas having relatively heavy atoms. When the ions strike the target material, atoms or molecules are ejected from the target material in the direction of another material. The ejected atoms or molecules accumulate on the surface of the other material as a film or layer(s) of the target material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
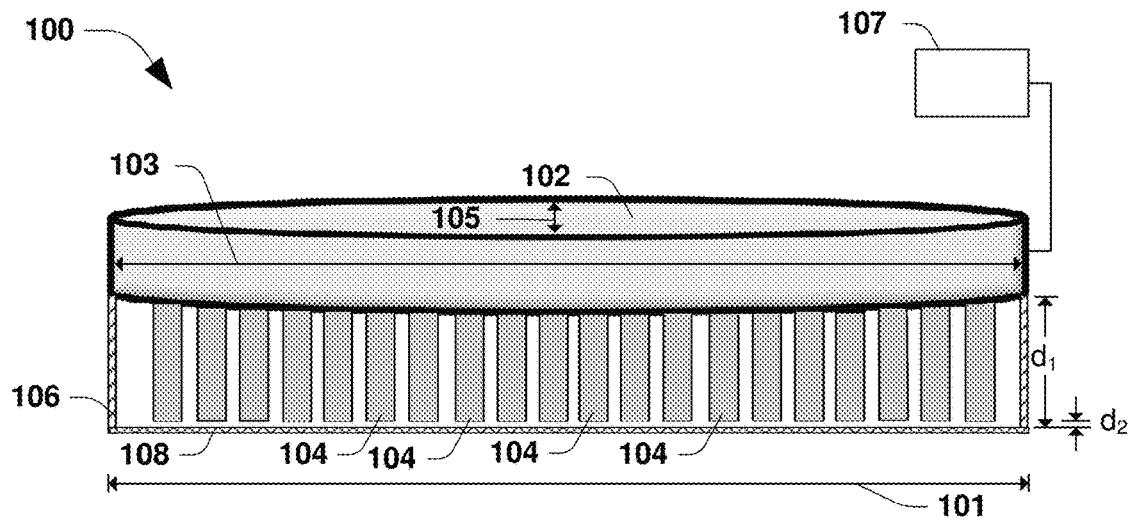
FIG. 1A is an illustration of a magnetron, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more apparatuses and methods for physical vapor deposition (PVD) are provided herein. An apparatus for PVD comprises a magnetron having a plurality of electromagnets disposed between a base and a magnetic conductive plate. The electromagnets are coupled to the base in a one-dimensional or two-dimensional arrangement. In some embodiments, each electromagnet is independently controlled by the magnetron such that some electromagnets may be active while other electromagnets are concurrently inactive. In some embodiments, the electromagnets are arranged in groups, and each group of electromagnets is independently controlled by the magnetron. The electromagnets are coupled to a current source and a current regulator. In some embodiments, the magnetron is configured to provide a positive current to some active electromagnets and concurrently provide a negative current to other active electromagnets. The magnetron can thereby configure some active electromagnets to have a North/South (N/S) polarity and configure other active electromagnets to have a South/North (S/N) polarity.

Magnetic fields arise between electromagnets of opposite polarities (i.e., N/S and S/N). Because electromagnets are independently (or as a group) selectively active or inactive and selectively configured to have either an N/S polarity or a S/N polarity, the magnetron is configured to generate magnetic fields of different shapes and strengths by setting respective electromagnets to be inactive, active with a positive polarity, or active with a negative polarity. The shape and strength of the magnetic field can be altered by the current regulator by modifying which electromagnets (or groups of electromagnets) are inactive, active with a positive polarity, or active with a negative polarity.

The current regulator may also set the strength of each electromagnet by controlling the amount of current provided to each respective electromagnet or to each respective group of electromagnets. Thus, the magnetron is versatile and easily reconfigurable to generate magnetic fields of different shapes and strengths, as opposed to magnetrons that have permanently active magnets of fixed polarities at permanent locations. Moreover, the magnetron may be readily deactivated by deactivating the plurality of electromagnets so as to not generate a magnetic field that could cross-influence a nearby process or device function, such as an adjacent PVD chamber. In contrast, magnetrons that have permanent magnets cannot be deactivated and can generate magnetic fields that may cross-influence nearby processes or devices.

The magnetic conductive plate underlies the plurality of electromagnets and comprises a plurality of receptacles. The receptacles are configured to receive a respective removable magnetic conductive segment or remain blank. Thus, in some embodiments, some areas of the magnetic conductive plate have magnetic conductive segments that underlie some of the plurality of electromagnets, and other areas of the magnetic conductive plate under other electromagnets of the plurality of electromagnets are void of magnetic conductive segments. Because magnetic conductive segments can be inserted or removed from receptacles at least one of during manufacturing or during a PVD process, the magnetic conductive plate can be configured in numerous ways. For example, magnetic conductive segments can be inserted only in receptacles of the magnetic conductive plate that will or may be under active electromagnets.

The removable magnetic conductive segments enhance the shape and strength of the magnetic field generated by the active electromagnets. If some active electromagnets are deactivated and other inactive electromagnets are activated, the magnetic conductive segments may be inserted into and/or removed from corresponding electromagnetic locations of the magnetic conductive plate at least one of during manufacture or during a PVD process. By way of the magnetic conductive plate and the magnetic conductive segments, the versatility of the magnetron is further enhanced over magnetrons that have permanent magnets.

One or more PVD chambers comprise the magnetron disposed therein. The magnetron is adjustable to generate magnetic fields of different shapes and strengths within the deposition chamber. An area of a magnetic field generated near a target material confines electrons to the area near the target material. Thus, the area near the target material has a high concentration of electrons.

An inert gas is introduced into the deposition chamber. Atoms of the inert gas that flow near or into the magnetic field are bombarded by the electrons. The bombarding electrons collide with and dislodge electron(s) of the inert gas, creating a plasma. The positively charged ions of the plasma are attracted to the target material, and impact the target material with force sufficient to dislodge atom(s) or molecule(s) of the target material and propel the atom(s) or molecule(s) toward the surface of a substrate or other material, thereby forming a layer or layers of the target material on the surface of the substrate.

Because the magnetic field generated by the magnetron is modifiable during a PVD process, the deposition rate and uniformity of a deposition material formed over the surface of the substrate or other material is controllable/modifiable during the execution of a PVD process. The magnetic field is readily modified by adjusting the current supplied to the electromagnets, rendering physical adjustments unnecessary. In contrast, magnetrons that comprise permanent magnets are modifiable through an involved, physical process that comprises removing the magnetron from the deposition chamber, removing the permanent magnets, installing permanent magnets of different strengths and different polarities at different locations in the magnetron, and reinstalling the magnetron in the deposition chamber.

The magnetic field generated by the disclosed magnetron is modifiable between different PVD processes by adjusting the current supplied to the electromagnets, thereby shortening the event/redesign time between different PVD processes, relative to permanent magnet magnetrons.

FIG. 1A is an illustration of a magnetron 100, according to some embodiments. The magnetron 100 comprises a base 102, a plurality of electromagnets 104, and a magnetic conductive plate 108. The plurality of electromagnets 104 are disposed between the base 102 and the magnetic conductive plate 108. The plurality of electromagnets 104 are electrically coupled to the base 102 and are arranged on the base 102 in a one-dimensional or two-dimensional shape. The shape of the plurality of electromagnets 104 may be at least one of linear, curved, elliptical, closed-polygonal, or open-polygonal, may comprise at least one of linear portions or curved portions, or other suitably shaped portions. In some embodiments, the shape of the base 102 corresponds to the shape of the arrangement of the plurality of electromagnets 104. For example, the plurality of electromagnets 104 may be arranged in an elliptical shape, and the shape of the base 102 may be elliptical to match the shape of the plurality of electromagnets. In some embodiments, the shape of the base 102 is different from the shape of the arrangement of the plurality of electromagnets 104. In some embodiments, the shape of the magnetic conductive plate 108 corresponds to the shape of the arrangement of the plurality of electromagnets 104. For example, the plurality of electromagnets 104 may be arranged in an elliptical shape, and the shape of the magnetic conductive plate 108 may be elliptical to match the shape of the plurality of electromagnets. In some embodiments, the shape of the magnetic conductive plate 108 is different from the shape of the arrangement of the plurality of electromagnets 104. Other configurations of the base 102, the plurality of electromagnets 104, and the magnetic conductive plate 108 are within the scope of the present disclosure.

A width 103 or a length 105 of the base 102 may be the same as a width 101 or a length of the magnetic conductive plate 108. The width 103 or the length 105 of the base 102 may be different from the width 101 or the length of the magnetic conductive plate 108. A width or a length of the plurality of electromagnets 104 may be the same as a width or a length of at least one of the base 102 or the magnetic conductive plate 108. A width or a length of the plurality of electromagnets 104 may be different from a width or a length of at least one of the base 102 or the magnetic conductive plate 108.

The base 102 may be electrically coupled between the plurality of electromagnets 104 and an external direct or alternating current source 107. In some embodiments, a magnetic conductive plate support 106 physically couples the magnetic conductive plate 108 to the base 102 and maintains at least one of a first distance $d_1$ between the base 102 and the magnetic conductive plate 108 or a second distance $d_2$ between the plurality of electromagnets 104 and the magnetic conductive plate 108. Other configurations for coupling the magnetic conductive plate 108 to the base 102 are within the scope of the present disclosure.

Figure 1B:
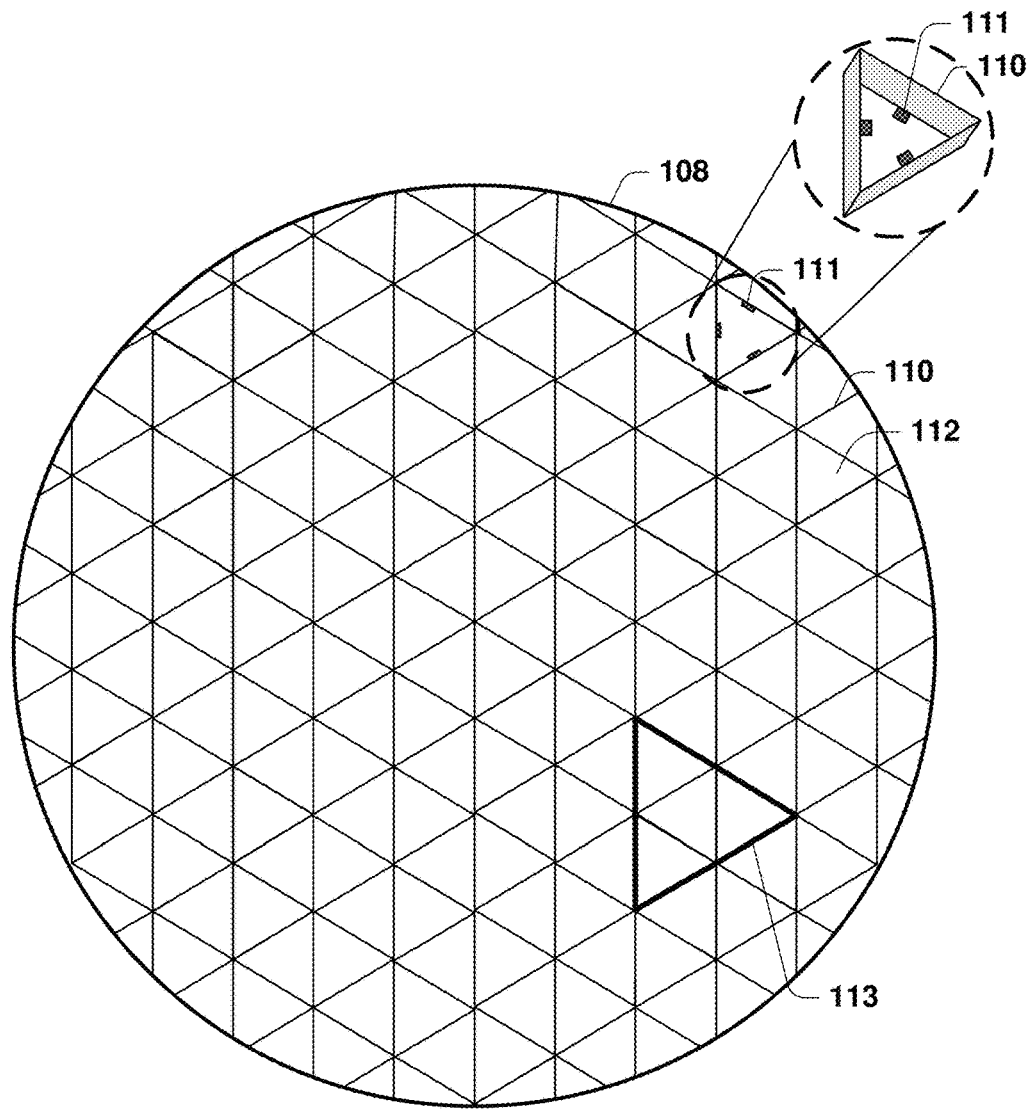
FIG. 1B is a bottom view of a magnetic conductive plate, according to some embodiments.

Referring to FIG. 1B, which illustrates a bottom view of the magnetic conductive plate 108, the magnetic conductive plate 108 comprises side surfaces 110 defining a plurality of receptacles 112, according to some embodiments. At least some receptacles of the plurality of receptacles 112 comprise rim surfaces 111. The rim surfaces 111 support magnetic conductive segments (not illustrated in FIG. 1B) disposed within at least some receptacles of the plurality of receptacles 112. Other configurations of the magnetic conductive plate 108 are within the scope of the present disclosure.

The receptacles 112 may respectively have at least one of an elliptical shape, a polygonal shape, etc., or comprise elliptical and polygonal regions. In some embodiments, the side surfaces 110 define a pattern of triangular receptacles. A collective shape 113 of several receptacles may be elliptical, polygonal, etc., or comprise elliptical and polygonal regions. In some embodiments, the collective shape 113 of several receptacles is triangular. Other configurations of the plurality of receptacles 112 are within the scope of the present disclosure.

Figure 2:
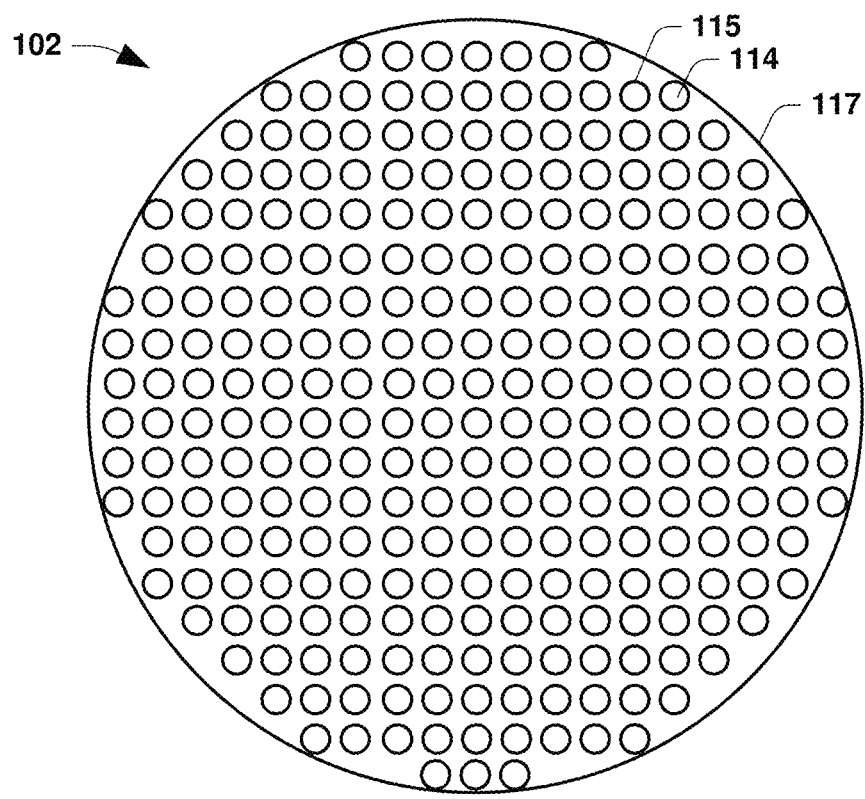
FIG. 2 is a bottom view of a base of a magnetron, according to some embodiments.

FIG. 2 is a bottom view of the base 102 of the magnetron 100, according to some embodiments. The base 102 comprises side surfaces 115 defining a plurality of conductor receptacles 114. Conductor receptacles 114 may be elliptical, polygonal, etc., or comprise elliptical and polygonal regions.

The conductor receptacles 114 may be arranged into one or more shapes. The one or more shapes may be arranged as a plurality of shapes with overlapping regions, as a plurality of non-overlapping shapes, or may be arranged as a plurality of shapes with overlapping regions and a plurality of non-overlapping shapes. The one or more shapes may be linear, elliptical, polygonal, or comprise linear, elliptical, and/or polygonal regions. In some embodiments, the conductor receptacles 114 are arranged in rows and columns. In some embodiments, the conductor receptacles 114 are arranged in accord with the shape of the base 102. In some embodiments, the plurality of conductor receptacles 114 comprises conductor receptacles arranged within a circular region 117 of the base 102. Other configurations of the plurality of conductor receptacles 114 are within the scope of the present disclosure.

Figure 3:
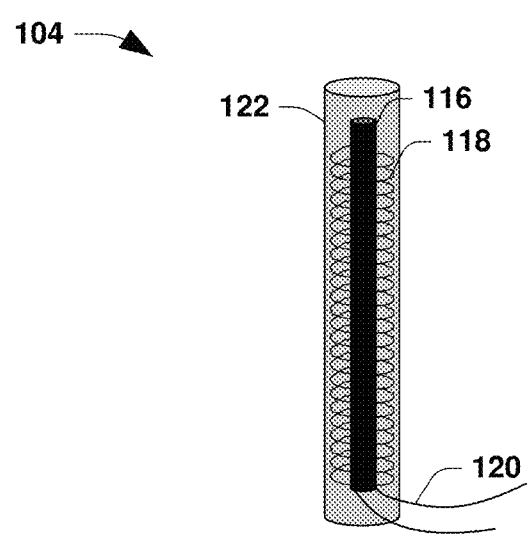
FIG. 3 is an illustration of an electromagnet, according to some embodiments.

FIG. 3 is an illustration of the electromagnet 104 of the magnetron 100, according to some embodiments. The electromagnet 104 comprises a magnetic core 116, a coil 118 surrounding the magnetic core 116, and an encapsulator 122 encapsulating the magnetic core 116 and the coil 118. In some embodiments, the coil 118 comprises a conductor 120 having at least a portion that protrudes outside of the encapsulator 122. In some embodiments, a diameter of the coil 118 is between about 0.5 to about 4 millimeters such that the electromagnet 104 is configured to generate a magnetic field having a strength sufficient to encompass an area below the magnetic conductive plate 108. The conductor 120 passes through a conductor receptacle 114 of the plurality of conductor receptacles of the base 102 to connect the electromagnet 104 to a current source 107 of the base 102 or other current source. Other configurations of the electromagnet 104 are within the scope of the present disclosure.

The current source 107 may source a positive current to the electromagnet 104 to configure the electromagnet 104 to a first polarity. The current source 107 may source a negative current to the electromagnet 104 to configure the electromagnet 104 to a second polarity, opposite the first polarity. The current source 107 may be switchable to source either a positive current or a negative current to the electromagnet 104. The current source 107 may be switchable to source zero current to the electromagnet 104. In some embodiments, a switch (not shown) having an open-circuit state and a closed-circuit state is coupled between the current source 107 and the conductor 120. Other configurations of the current source 107 are within the scope of the present disclosure.

The magnetic core 116 may comprise a material with a high magnetic permeability, such as a magnetic permeability of at least $6 \times 10^{-3} \mu$ such that the electromagnet 104 is configured to generate a magnetic field having a strength sufficient to encompass an area below the magnetic conductive plate 108. In some examples, the material of the magnetic core 116 comprises at least one of a ferromagnetic material, a ferrimagnetic compound, etc. In some embodiments, the magnetic core 116 comprises a material such as iron. In some embodiments, the magnetic core 116 comprises iron sheets laminated with a magnetically reluctant material having low magnetic permeability. In some embodiments, a diameter of the magnetic core 116 is between about 2 to about 6 millimeters such that the electromagnet 104 is configured to generate a magnetic field having a strength sufficient to encompass an area below the magnetic conductive plate 108. Other configurations of the magnetic core 116 are within the scope of the present disclosure.

The encapsulator 122 comprises a magnetic-isolated material with a magnetic permeability that is less than $1.3 \times 10^{-6} \mu$ to contain the magnetic field generated by the electromagnets 104. In some examples, a material of the encapsulator 122 comprises at least one of aluminum, stainless steel, copper, etc. In some embodiments, a diameter of the encapsulator 122 is less than 12 millimeters to contain the magnetic field generated by the electromagnets 104. Other configurations of the encapsulator 122 are within the scope of the present disclosure.

Figure 4:
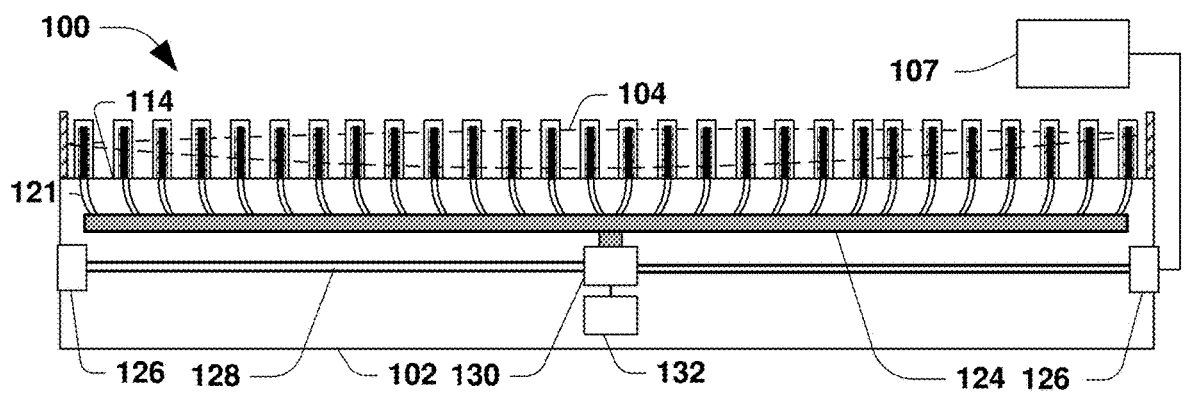
FIGS. 4-6 are illustrations of a magnetron, according to some embodiments.
Figure 5:
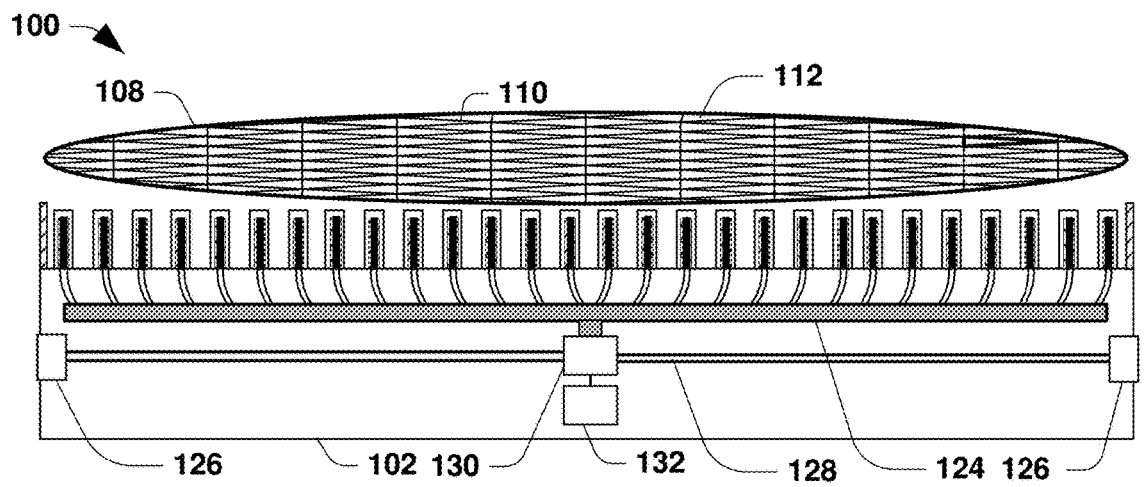
Figure 6:
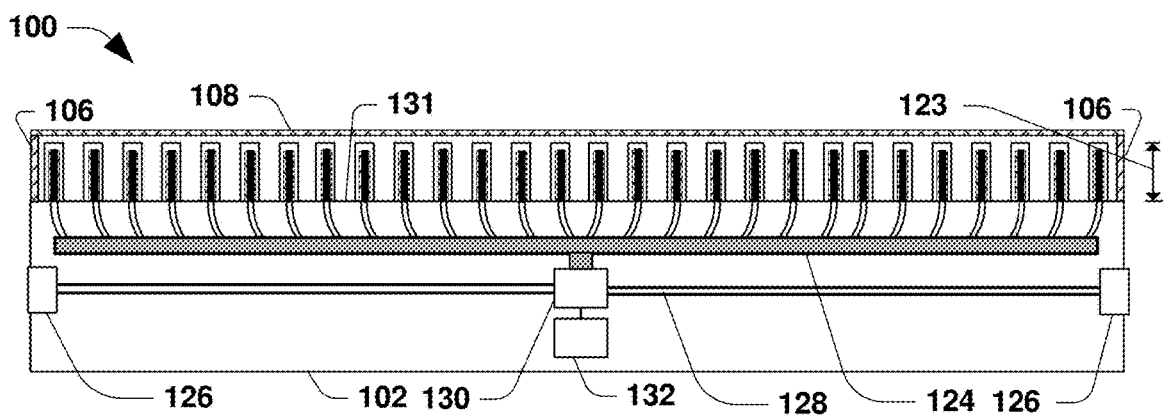

FIGS. 4-6 are illustrations of a magnetron 100, according to some embodiments.

Referring to FIG. 4, the base 102 of the magnetron 100 comprises a current regulator 130 coupled to a programmer 132. The current regulator 130 is electrically coupled to the electromagnets 104 (collectively represented by the dashed ellipse) by way of a plurality of conductors 121. The conductors 121 pass through the conductor receptacles 114. The base 102 may comprise a conductor guide 124 to confine the plurality of conductors 121 to an area within the base 102.

The current regulator 130 is electrically coupled to one or more electromagnets 104 by way of one or more conductors 121. The current regulator 130 may be electrically coupled to a current receptacle 126 to electrically couple the current regulator 130 to the external direct current or alternating current source 107 illustrated in FIG. 1A. In some embodiments, a conductor 128 is electrically coupled to the current receptacle 126 and the current regulator 130. The current receptacle 126 is configured to transmit current from the external direct current or alternating current source 107 to the conductor 128. Other configurations of the current receptacle 126 and the current regulator 130 are within the scope of the present disclosure.

The programmer 132 is electrically coupled to the current regulator 130 to configure the current regulator 130 to activate at least one of the electromagnets 104, and to concurrently deactivate at least one other electromagnet 104. The programmer 132 may also configure the current regulator 130 to activate at least one of the electromagnets 104 to a first polarity and concurrently activate at least one other electromagnet 104 to a second polarity, opposite the first polarity. Other configurations of the programmer 132 are within the scope of the present disclosure.

Referring to FIG. 5 and FIG. 6, the magnetron 100 comprises the magnetic conductive plate 108. In FIG. 5, the magnetic conductive plate 108 is illustrated over the plurality of electromagnets 104 for clarity of explanation. As illustrated in FIG. 5, the receptacles 112 are over the electromagnets 104. In some embodiments, one receptacle 112 is respectively over one electromagnet 104. In some embodiments, one receptacle 112 is over at least two electromagnets 104. In some embodiments, at least two receptacles 112 are over one electromagnet 104. In some embodiments, at least two receptacles 112 are over at least two electromagnets 104. Other configurations of receptacles 112 and electromagnets 104 are within the scope of the present disclosure.

FIG. 6 illustrates the magnetic conductive plate 108 coupled to the base 102 and over the plurality of electromagnets 104. At least one electromagnet 104 may have a first height 123, and at least one electromagnet 104 may have a second height. The first height may be the same as or different than the second height. In some embodiments, all electromagnets 104 have a same height.

The magnetic conductive plate 108 may be parallel with an upper surface 131 of the base 102. In some embodiments, the magnetic conductive plate 108 is angled with respect to the upper surface 131 of the base 102. In some embodiments, first portions of the magnetic conductive plate 108 are a first distance from the upper surface 131 of the base 102, and second portions of the magnetic conductive plate 108 are a second distance from the upper surface 131 of the base 102. The first distance may be equal to or different than the second distance.

Figure 7A:
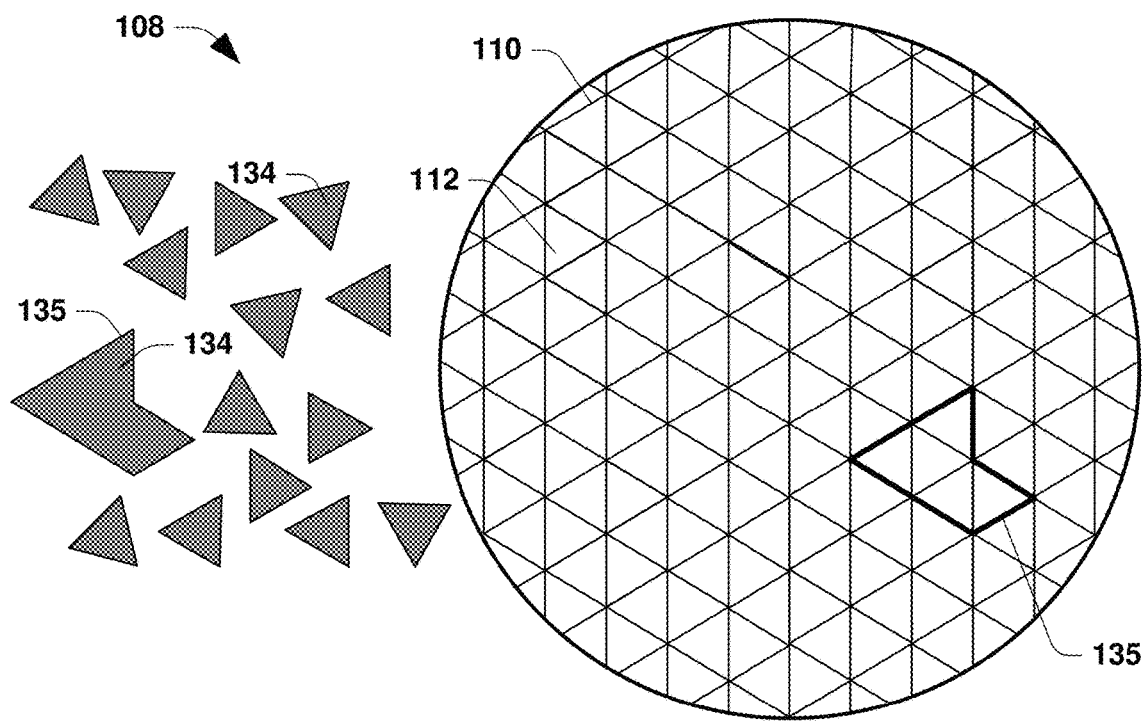
FIGS. 7A and 7B are illustrations of a magnetic conductive plate, according to some embodiments.
Figure 7B:
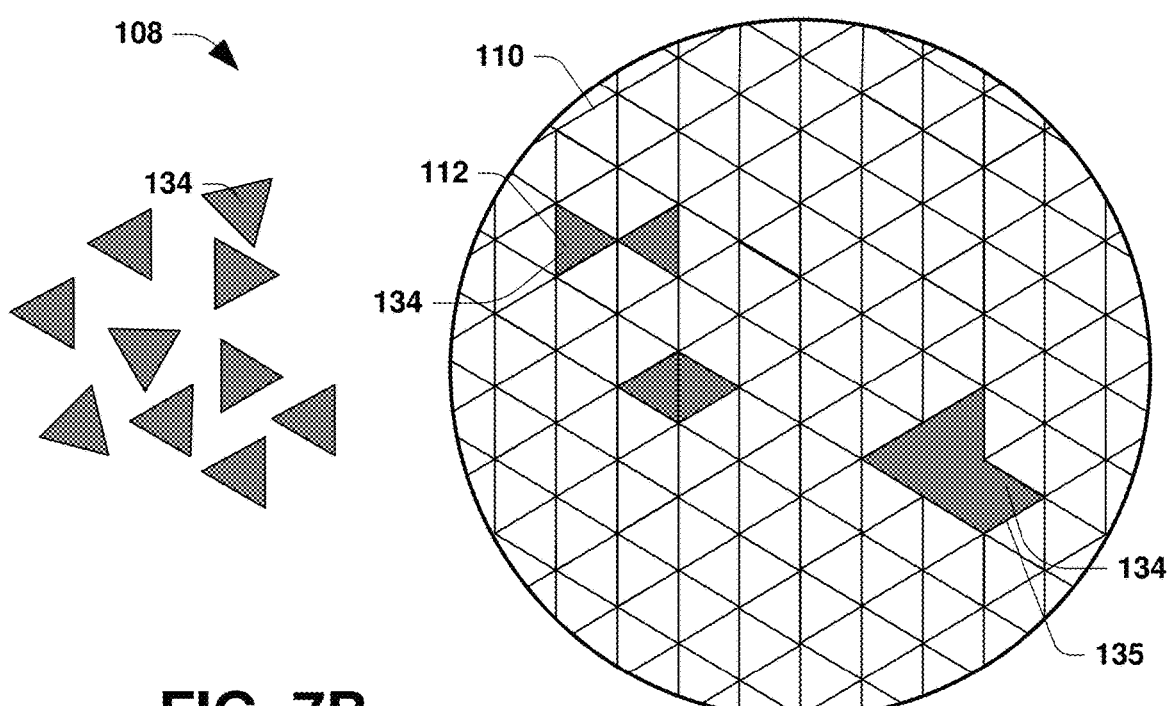

FIGS. 7A and 7B are illustrations of the magnetic conductive plate 108, according to some embodiments. FIGS. 7A and 7B comprise illustrations of magnetic conductive segments 134 that are configured to fit within some of the receptacles 112. FIG. 7B illustrates some magnetic conductive segments 134 disposed within some of the receptacles 112. At least one magnetic conductive segment 134 has a first shape and at least one receptacle 112 has a second shape. The first shape may be the same as or different than the second shape. In some embodiments, a shape of a magnetic conductive segment 135 of the magnetic conductive segments 134 is the same as a shape of a collective sub-plurality of receptacles 112. According to some embodiments, a material of the magnetic conductive segments 134 is a ferromagnetic alloy having a magnetic permeability between $20 \times 10^{-6} \mu$ and $900 \times 10^{-6} \mu$ to correspond to the magnetic permeability of the magnetic conductive plate 108. According to some embodiments, a material of the magnetic conductive plate 108 is a ferromagnetic alloy having a magnetic permeability between $20 \times 10^{-6} \mu$ and $900 \times 10^{-6} \mu$ to correspond to the magnetic permeability of the magnetic conductive segments 134. Other dimensional and material relationships among the magnetic conductive segments 134, the magnetic conductive plate 108, and the receptacles 112 are within the scope of the present disclosure.

The number of receptacles 112 may be greater than, the same as, or less than the number of receptacles depicted in FIG. 7A. The number of receptacles 112 may be in the thousands, hundreds, tens, or less. The number of magnetic conductive segments 134 may be greater than, the same as, or less than the number of magnetic conductive segments depicted in FIG. 7A. The number of magnetic conductive segments 134 may be in the thousands, hundreds, tens, or less. The number of receptacles 112 filled with magnetic conductive segments 134 may be equal to or less than the total number of receptacles 112 of the magnetic conductive plate 108. Other quantities of receptacles 112 and magnetic conductive segments 134 are within the scope of the present disclosure.

Each receptacle 112 may be filled with a magnetic conductive segment 134. In some embodiments, some receptacles 112 are filled with magnetic conductive segments 134 while some other receptacles 112 are void of magnetic conductive segments 134. The collective configuration of filled receptacles 112 at least partially influences the shape and intensity of the magnetic field generated by the magnetron 100. For example, the strength of a first portion of a magnetic field generated by the magnetron 100 may be greater than the strength of a second portion of the magnetic field if electromagnets 104 that create the first portion of the magnetic field are more proximate to, or directly under, receptacles 112 filled with magnetic conductive segments 134, while electromagnets that create the second portion of the magnetic field are more proximate to unfilled receptacles 112 or more proximate to a greater number of unfilled receptacles 112. In addition to the configuration of filled and unfilled receptacles 112 depicted in FIG. 7B, many other configurations of filled receptacles 112 and unfilled receptacles 112 of the magnetic conductive plate 108 are within the scope of the present disclosure.

In some embodiments, the thickness of the magnetic conductive plate 108 is 2-4 nanometers, and the thicknesses of the magnetic conductive segments 134 are 4 millimeters or less to control the magnetic field generated by electromagnets 104 activated by the base 102.

Figure 8:
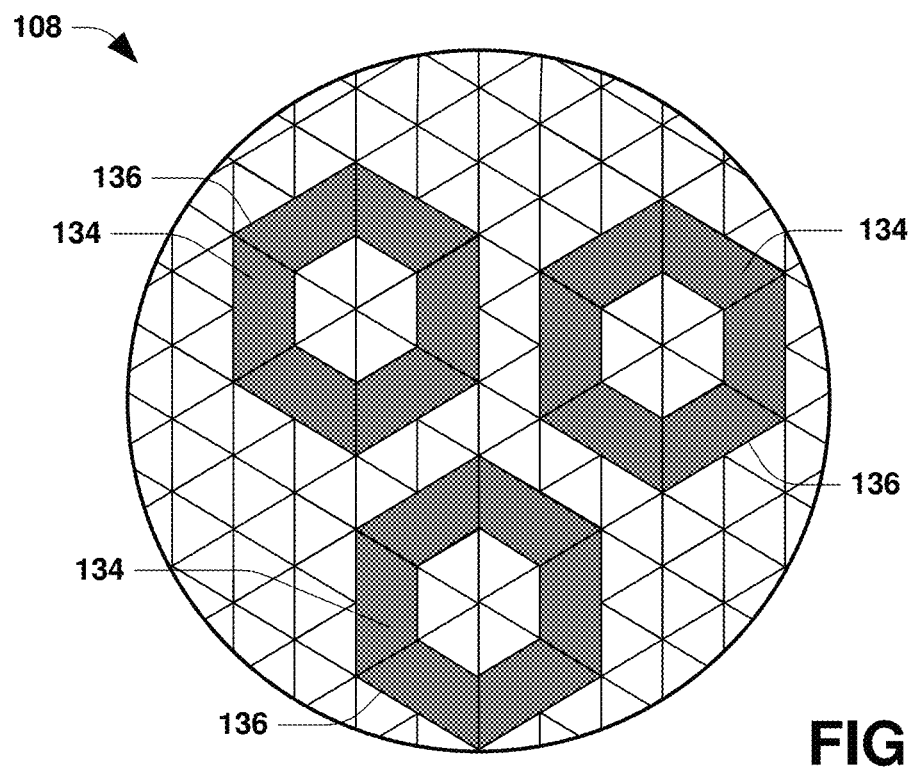
FIG. 8 is an illustration of a magnetic conductive plate, according to some embodiments.

FIG. 8 is an illustration of the magnetic conductive plate 108, according to some embodiments. The magnetic conductive plate 108 may comprise magnetically conductive areas 136 defined by magnetic conductive segments 134. Some magnetic conductive segments 134 disposed within some receptacles 112 collectively define at least one of an elliptical shape, polygonal shape, etc. In some embodiments, a first magnetically conductive area of the magnetically conductive areas 136 has a first shape and a second magnetically conductive area of the magnetically conductive areas 136 has a second shape. The first shape may be the same as or different than the second shape. Each of the magnetically conductive areas 136 may control or strengthen the magnetic field generated by electromagnets 104 activated by the base 102.

Figure 9:
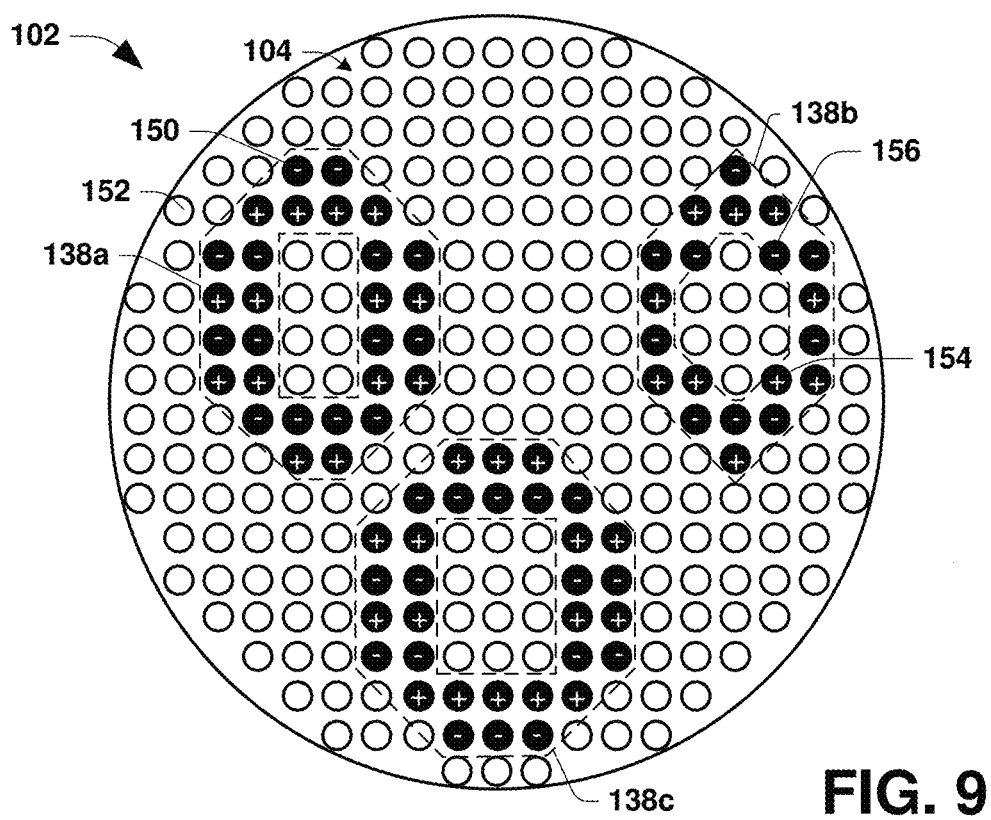
FIG. 9 is an illustration of a plurality of electromagnets and a base, according to some embodiments.

FIG. 9 is an illustration of the electromagnets 104 and the base 102, according to some embodiments. First portions 150 (illustrated in dark) of the electromagnets 104 are activated by the base 102 to form active-electromagnet areas 138a, 138b, or 138c. A first active-electromagnet area 138a has a first shape, a second active-electromagnet area 138b has a second shape, and a third active-electromagnet area 138c has a third shape. The first shape, second shape, and third shape may be the same or different shapes. In some embodiments, each of the active-electromagnet areas 138a, 138b, or 138c generates lines of magnetic flux between electromagnets 104 of opposite polarities, such as between a first electromagnet 154 and a second electromagnet 156. The base 102 deactivates or maintains a deactivated state of second portions 152 (illustrated in white) of the plurality of electromagnets 104. In some embodiments, some second portions 152 are between active electromagnets 104 of opposite polarities (e.g., between first electromagnet 154 and second electromagnet 156).

The base 102 may be configured to activate electromagnets in active-electromagnet areas 138a, 138b, or 138c that have the same, similar, or different shape(s) as magnetically conductive areas of the magnetic conductive plate 108. Activating electromagnets 104 in an active-electromagnet area that has a same or similar shape as a magnetically conductive area of the magnetic conductive plate 108 may control or strengthen the magnetic field generated by the magnetron 100.

Figure 10:
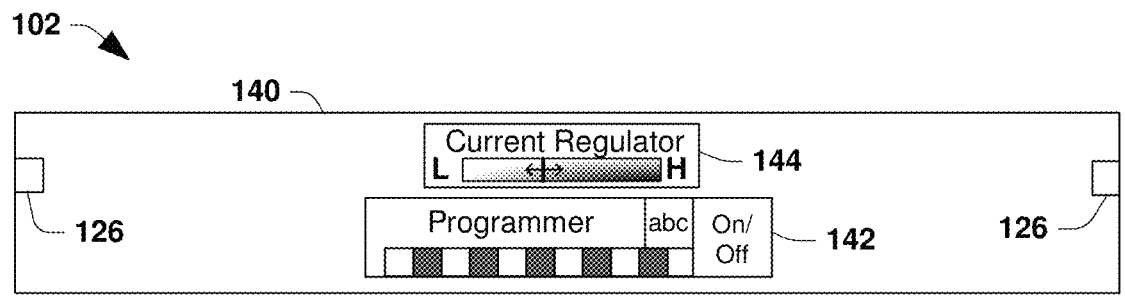
FIG. 10 is an illustration of a base of a magnetron, according to some embodiments.

FIG. 10 is an illustration of the base 102 of the magnetron 100, according to some embodiments. The base 102 comprises an interface 140 comprising the current receptacle 126, a programmer interface 142, and a current regulator interface 144. The programmer interface 142 is configured to receive control commands for configuring the base 102. Controls received by the programmer interface 142 may comprise controls to activate or deactivate (turn on or off) individual or groups of electromagnets 104. For example, the controls received at the programmer interface 142 may be directed at activating and deactivating specific electromagnets 104 or groups of electromagnets 104, as illustrated in FIG. 9. The programmer interface 142 may be configured to receive manual control commands, electrical signal data control commands, manual and electrical signal data control commands, or other forms of commands.

The current regulator interface 144 may be configured to receive controls directed at configuring the base 102 to provide different levels of current to individual or groups of electromagnets 104. In some embodiments, the current regulator interface 144 is configured to receive commands of levels of current between a low level (L) and a high level (H). The low level may correspond to the lowest current level provided to an individual electromagnet 104 or group(s) of electromagnets 104. The high level may correspond to the highest current level provided to an individual electromagnet 104 or group(s) of electromagnets 104. The current regulator interface 144 may receive controls directed at configuring the base 102 to provide a current level to an individual electromagnet 104 or group(s) of electromagnets 104 between the low level and the high level. Thus, the shape and strength of magnetic flux is adjustable by commands received at the programmer interface 142, the current regulator interface 144, or other suitable source.

In some embodiments, the base 102 comprises a memory device (not shown). The memory device may store electrical current configurations of the electromagnets 104 that correspond to parameters of an electromagnetic field for one or more purposes. The memory device may store magnetron performance parameters and data that can be referenced to determine whether components of the magnetron 100 were or are operating correctly or are degrading or faulty.

Figure 11:
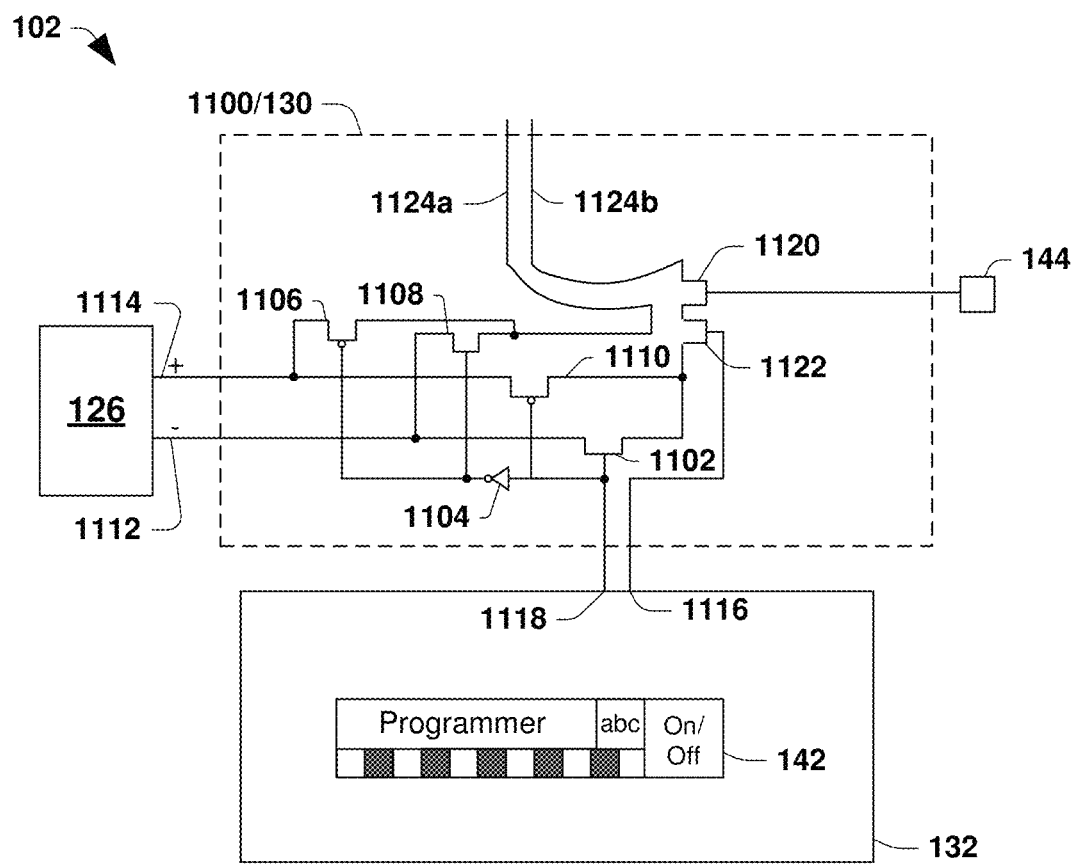
FIG. 11 is an illustration of a base of a magnetron, according to some embodiments.

FIG. 11 is an illustration of the base 102 of the magnetron 100, according to some embodiments. FIG. 11 depicts a portion 1100 of the current regulator 130, the programmer 132, and the current receptacle 126. The depicted portion 1100 of the current regulator 130 may be replicated (not illustrated) within the base 102 for each electromagnet 104. The portion 1100 of the current regulator 130 comprises a first conductor 1124a and a second conductor 1124b to couple the base 102 to at least one electromagnet 104. Other configurations of the base 102, the current regulator 130, or the portion 1100 of the current regulator 130 are within the scope of the disclosure.

The current regulator 130 comprises a variable resistance switch 1120 having a control terminal electrically coupled to the current regulator interface 144 and active terminals electrically coupled between the second conductor 1124b and a first terminal 1112 of the current receptacle 126. In a first (off) state of the portion 1100 of the current regulator 130, the programmer 132 outputs a low potential at a first programmer terminal 1116 coupled to a control terminal of the on/off switch 1122 to open the conductive path between the second conductor 1124b and the first terminal 1112 of the current receptacle 126. In a second (on) state, the programmer 132 outputs a high potential at the first programmer terminal 1116 to close the conductive path between the second conductor 1124b and the first terminal 1112 of the current receptacle 126.

The current regulator 130 comprises a first switch 1102 having a control terminal coupled to the programmer 132 and active terminals electrically coupled between the second conductor 1124b and the first terminal 1112 of the current receptacle 126. An inverter 1104 is electrically coupled between the programmer 132 and a control terminal of a second switch 1106. The inverter 1104 is electrically coupled to a control terminal of a third switch 1108. The active terminals of the third switch 1108 are coupled between the first terminal 1112 of the current receptacle 126 and the first conductor 1124a. A fourth switch 1110 comprises a control terminal electrically coupled to the programmer 132, and active terminals electrically coupled between the first conductor 1124a and a second terminal 1114 of the current receptacle 126.

In some embodiments, the programmer 132 is programmed to deactivate an electromagnet by opening the on/off switch 1122 and activate the electromagnet by closing the on/off switch 1122. The programmer 132 is programmed to configure the current regulator 130 to electrically couple the first conductor 1124a and the second conductor 1124b to, respectively, a first potential or a second potential current source supplied by the current receptacle 126. In some embodiments, the first potential is a positive current that generates a first polarity of the electromagnet, and the second potential is a negative current that generates a second polarity of the electromagnet.

To configure the current regulator 130 to provide the first polarity, the programmer 132 outputs a high signal at second programmer terminal 1118. The high signal closes the first switch 1102 to electrically couple the first terminal 1112 of the current receptacle 126 to the first conductor 1124a. The high signal is inverted to a low signal by inverter 1104. The low signal provided by inverter 1104 closes the second switch 1106 to electrically couple the second terminal 1114 of the current receptacle 126 to the second conductor 1124b, and electrically decouple the first terminal 1112 of the current receptacle 126 from the first conductor 1124a.

To configure the current regulator 130 to provide the second polarity, the programmer 132 outputs a low signal at second programmer terminal 1118. The low signal opens the first switch 1102 to electrically decouple the first terminal 1112 of the current receptacle 126 from the first conductor 1124a. The low signal is inverted to a high signal by inverter 1104. The high signal provided by inverter 1104 opens the second switch 1106 to electrically decouple the second terminal 1114 of the current receptacle 126 from the second conductor 1124b, and electrically couple the first terminal 1112 of the current receptacle 126 to the second conductor 1124b. Other configurations of the current regulator 130 are within the scope of the present disclosure.

Figure 12:
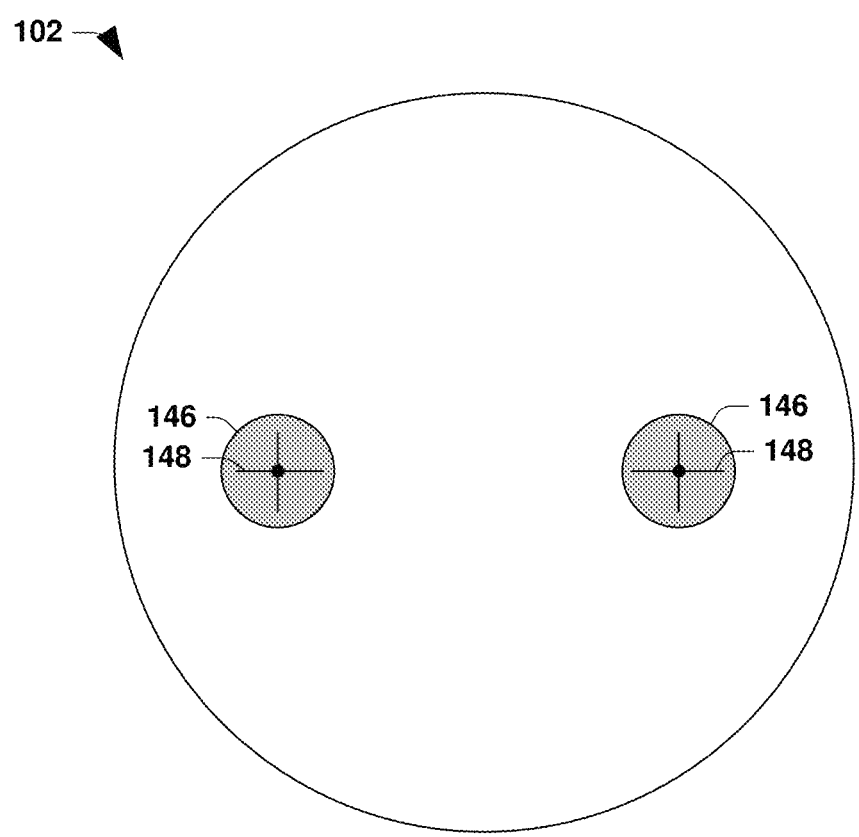
FIG. 12 is a top view of a base of a magnetron, according to some embodiments.

FIG. 12 is a top view of a base 102 of a magnetron 100, according to some embodiments. The base 102 may be comprised of a heat-sink magnetically reluctant material, such as aluminum, etc. The base 102 comprises a port(s) 146 to expel heat generated within the base 102. The base 102 may comprise a fan(s) 148 to increase the amount of heat expelled from the base 102. Other configurations to expel heat from the base 102 are within the scope of the present disclosure.

Figure 13:
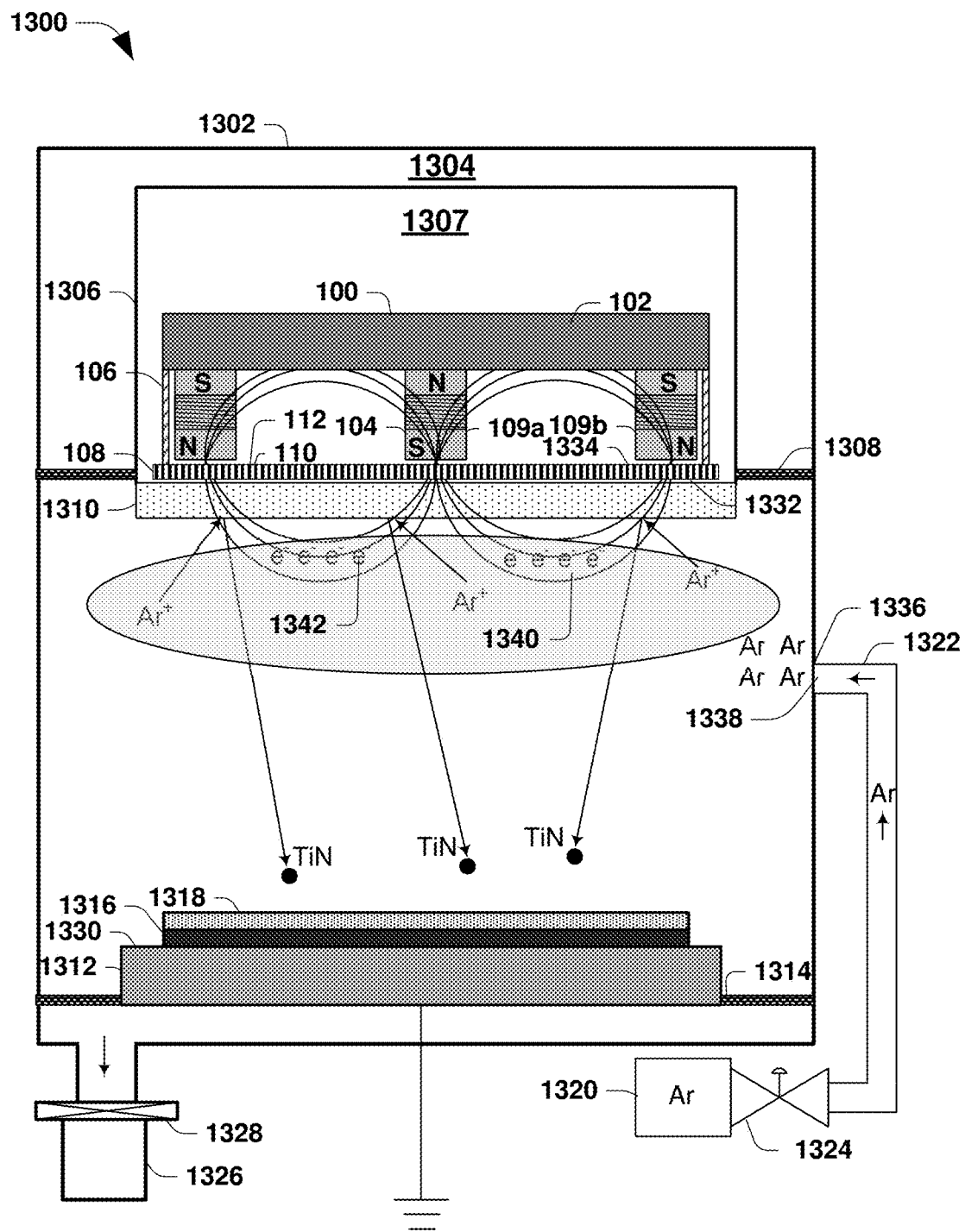
FIG. 13 is an illustration of a deposition device for physical vapor deposition, according to some embodiments.

FIG. 13 is an illustration of a deposition device 1300 for physical vapor deposition, according to some embodiments. The deposition device 1300 comprises a chamber housing 1302 defining a deposition chamber 1304. In some embodiments, a magnetron housing 1306 defining a magnetron chamber 1307 is disposed within the deposition chamber 1304. The magnetron housing 1306 may be supported in the deposition chamber 1304 by magnetron housing supports 1308. A magnetron 100 is disposed within the magnetron housing 1306. In some embodiments, the magnetron 100 is disposed within the deposition chamber 1304, wherein the chamber housing 1302 and the magnetron housing 1306 are the same housing.

In some embodiments, the magnetron 100 comprises the base 102, the electromagnets 104, the magnetic conductive plate support 106, the magnetic conductive plate 108, side surfaces 110, and the receptacles 112 as described with reference to FIGS. 1-12. The base 102 (side view illustrated in FIG. 13 with respect to the top view of FIG. 9) may comprise side surfaces 110 defining conductor receptacles 114 (not shown in FIG. 13) as described with reference to FIG. 2. In some embodiments, the magnetron 100 within the deposition chamber 1304 is similar to the magnetron 100 described with reference to FIGS. 1-12. Therefore, a further description of the magnetron 100 is omitted to avoid repetition of disclosure. Other configurations of a magnetron 100 within the deposition chamber 1304 are within the scope of the present disclosure.

In some embodiments, the electromagnets 104 are similar to the electromagnets 104 described with reference to FIG. 3. Therefore, a further description of the electromagnets 104 is omitted to avoid repetition of disclosure. The deposition device 1300 may be coupled to a programmer, such as the programmer 132 described with reference to FIG. 11, to configure a first electromagnet 109a to have a first polarity and a second electromagnet 109b to have a second polarity, opposite the first polarity. Other configurations of the electromagnets 104 and electromagnet polarities within the deposition chamber 1304 are within the scope of the present disclosure.

A target material 1310 is disposed between the magnetron 100 and a holder 1312 and underlies the magnetic conductive plate 108. The holder 1312 comprises a surface 1330 and is configured to hold a substrate 1316 or other material throughout a PVD process. In some embodiments, the holder 1312 is supported in the deposition chamber 1304 by holder supports 1314.

The deposition device 1300 comprises a vacuum pressure source 1326 coupled to the deposition chamber 1304 through a vacuum valve 1328. The vacuum valve 1328 may be opened to purge the deposition chamber 1304 of air and gasses prior to the introduction of a process gas into the deposition chamber. The vacuum valve 1328 may open to purge the deposition chamber 1304 of byproducts of a PVD process.

The chamber housing 1302 comprises a side surface 1336 defining a gas port 1338 to introduce a process gas into the deposition chamber 1304. The gas port 1338 is hermetically coupled to a gas source chamber 1320 coupled to a gas conduit 1322 and a gas flow regulator 1324. The gas source chamber 1320 comprises the process gas for introduction into the deposition chamber 1304 through the gas port 1338. In some embodiments, the process gas is an inert gas such as argon (Ar), as illustrated in FIG. 13. In some embodiments, the process gas is krypton, xenon, or other gas. Other inert gases for introduction into the deposition chamber 1304 through the gas port 1338 are within the scope of the present disclosure.

The deposition device 1300 deposits a layer or layers of the target material 1310/1318 over the substrate 1316 by causing atoms of the process gas to forcefully strike atoms or molecules of the target material 1310. Atoms or molecules of the target material 1310 forcefully struck by the atoms of the process gas propel toward the surface 1330, and hence the substrate 1316.

The process gas introduced into the deposition chamber 1304 flows into an electron charged magnetic field 1340 generated by the magnetron 100. The electron charged magnetic field 1340 flows through and below the target material 1310. The electrons of the electron charged magnetic field 1340 collide with electrons, such as outer electrons, of the process gas and cause one or more electrons of the process gas to eject, rendering positively charged atoms of the process gas. The positively charged atoms are strongly attracted to the concentration of electrons 1342 near the target material 1310 with energy sufficient to forcefully dislodge atoms or molecules off of the target material 1310. The atoms or molecules forcefully dislodged off the target material 1310 are propelled toward the substrate 1316 and form a layer of atoms or molecules of the target material 1310/1318 thereon. In some embodiments, the target material 1310 is titanium nitride (TiN). Other target materials 1310, such as aluminum copper (AlCu), tungsten (W), silicon (Si), tantalum (Ta), and other target materials, are within the scope of the present disclosure.

Figure 14:
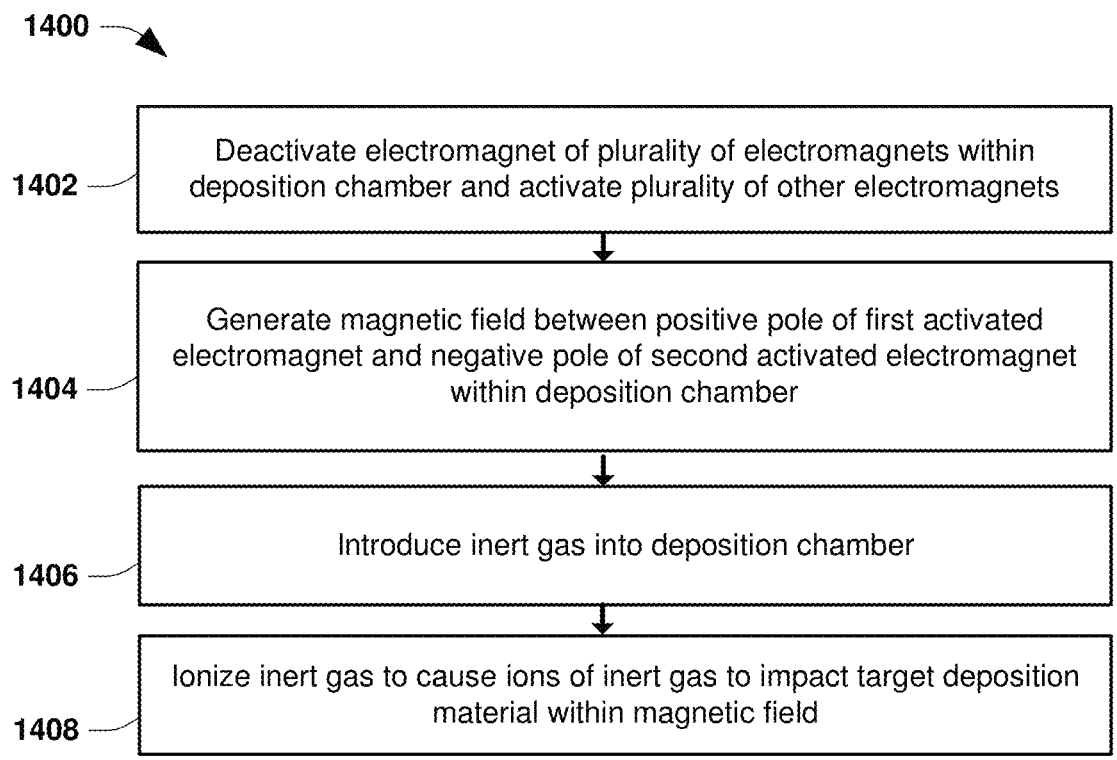
FIG. 14 is an illustration of a method of physical vapor deposition, according to some embodiments.

FIG. 14 is an illustration of a method 1400 of physical vapor deposition, according to some embodiments. The method may be applied to process tuning for the formation of high voltage microelectronics (HVM) or other processes.

The method 1400 of physical vapor deposition comprises deactivating an electromagnet of a plurality of electromagnets and activating a plurality of other electromagnets of the plurality of electromagnets within a deposition chamber 1402. A magnetic field is generated between a positive pole of a first activated electromagnet and a negative pole of a second activated electromagnet within the deposition chamber 1404. An inert gas is introduced into the deposition chamber 1406 and is ionized to cause ions of the inert gas to impact a target deposition material within the magnetic field 1408. A surface of a material within the deposition chamber is coated with atoms or molecules that originated from the target deposition material. Coating the surface of the material may comprise coating a surface of a substrate. In some embodiments, the inert gas is argon and the target deposition material comprises titanium.

Figure 15:
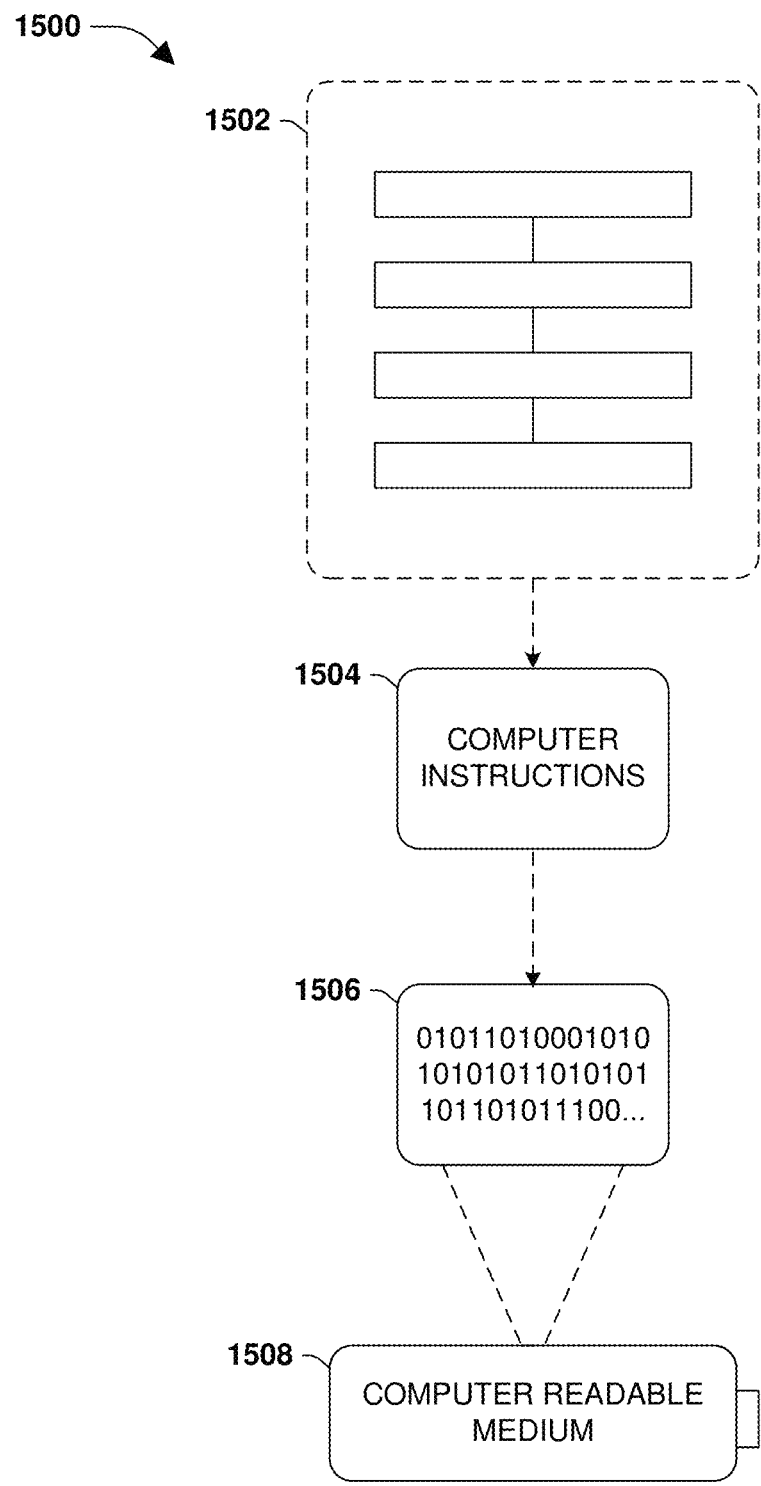
FIG. 15 is an illustration of an exemplary computer-readable medium, according to some embodiments.

FIG. 15 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 15, wherein the embodiment 1500 comprises a computer-readable medium 1508 (e.g., a CD-R, DVD-R, flash drive, a platter of a hard disk drive, etc.), on which is encoded computer-readable data 1506. This computer-readable data 1506 in turn comprises a set of processor-executable computer instructions 1504 that when executed are configured to facilitate operations according to one or more of the principles set forth herein. In some embodiments 1500, the processor-executable computer instructions 1504 are configured to facilitate performance of a method 1502, such as at least some of the aforementioned method(s). In some embodiments, the processor-executable computer instructions 1504 are configured to facilitate implementation of a system, such as at least some of the one or more aforementioned system(s). Many such computer-readable media may be devised by those of ordinary skill in the art that are configured to operate in accordance with the techniques presented herein.

Figure 16:
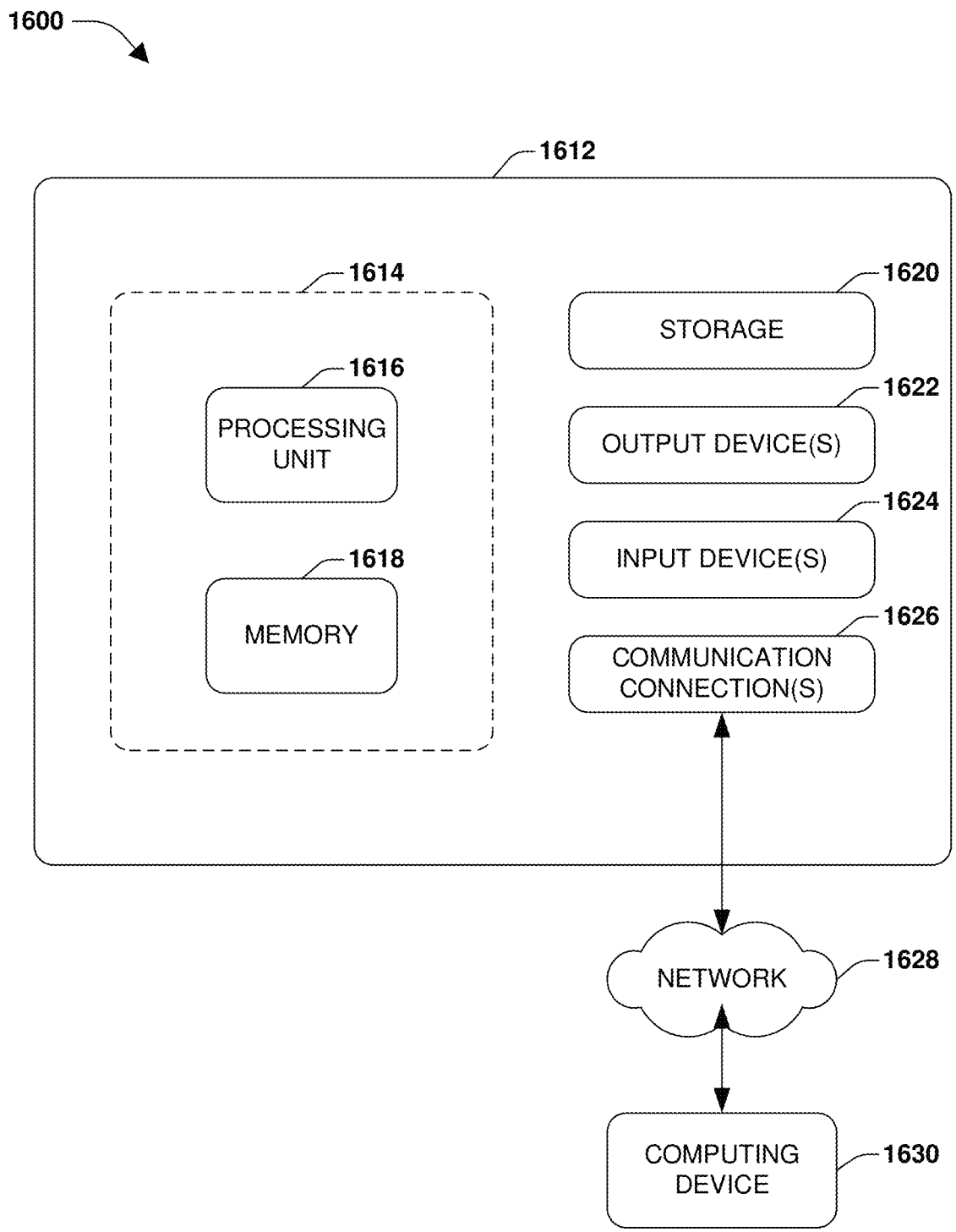
FIG. 16 illustrates an example computing environment wherein one or more of the provisions set forth herein may be implemented, according to some embodiments.

FIG. 16 and the following discussion provide a brief, general description of a suitable computing environment to implement embodiments of one or more of the provisions set forth herein. The computing environment of FIG. 16 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 16 depicts an example of a system 1600 comprising a computing device 1612 configured as the controller to implement some embodiments provided herein. In some configurations, computing device 1612 includes at least one processing unit 1616 and memory 1618. Depending on the exact configuration and type of computing device, memory 1618 may be volatile (such as RAM, for example), non-volatile (such as ROM, flash memory, etc., for example), or some combination of the two. This configuration is illustrated in FIG. 16 by dashed line 1614.

In some embodiments, computing device 1612 may include additional features and/or functionality. For example, computing device 1612 may also include additional storage (e.g., removable and/or non-removable) including, but not limited to, magnetic storage, optical storage, and the like. Such additional storage is illustrated in FIG. 16 by storage 1620. In some embodiments, computer readable instructions to implement one or more embodiments provided herein may be in storage 1620. Storage 1620 may also store other computer readable instructions to implement an operating system, an application program, and the like. Computer readable instructions may be loaded in memory 1618 for execution by processing unit 1616, for example.

The term "computer readable media" as used herein includes computer storage media. Computer storage media includes volatile and nonvolatile, removable and non-removable media implemented in any method or technology for storage of information such as computer readable instructions or other data. Memory 1618 and storage 1620 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1612. Any such computer storage media may be part of computing device 1612.

Computing device 1612 may also include communication connection(s) 1626 that allows computing device 1612 to communicate with other devices. Communication connection(s) 1626 may include, but is not limited to, a modem, a Network Interface Card (NIC), an integrated network interface, a radio frequency transmitter/receiver, an infrared port, a USB connection, or other interfaces for connecting computing device 1612 to other computing devices. Communication connection(s) 1626 may include a wired connection or a wireless connection. Communication connection(s) 1626 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1612 may include input device(s) 1624 such as keyboard, mouse, pen, voice input device, touch input device, infrared cameras, video input devices, and/or any other input device. Output device(s) 1622 such as one or more displays, speakers, printers, and/or any other output device may also be included in computing device 1612. Input device(s) 1624 and output device(s) 1622 may be connected to computing device 1612 via a wired connection, wireless connection, or any combination thereof. In some embodiments, an input device or an output device from another computing device may be used as input device(s) 1624 or output device(s) 1622 for computing device 1612.

Components of computing device 1612 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1612 may be interconnected by a network. For example, memory 1618 may be comprised of multiple physical memory units located in different physical locations interconnected by a network.

Those skilled in the art will realize that storage devices utilized to store computer readable instructions may be distributed across a network. For example, a computing device 1630 accessible via a network 1628 may store computer readable instructions to implement one or more embodiments provided herein. Computing device 1612 may access computing device 1630 and download a part or all of the computer readable instructions for execution. Alternatively, computing device 1612 may download pieces of the computer readable instructions, as needed, or some instructions may be executed at computing device 1612 and some at computing device 1630.

A magnetron 100 of the disclosure comprises a plurality of electromagnets 104 disposed between a base 102 and a magnetic conductive plate 108. Each electromagnet 104 is controlled by the magnetron 100 such that some electromagnets 104 are active while other electromagnets 104 are concurrently inactive. The magnetron 100 is configured to provide a positive current to some active electromagnets 104 and concurrently provide a negative current to other active electromagnets 104. Because, in some embodiments, each electromagnet 104 is individually active or inactive and individually configured to have either an N/S polarity or a S/N polarity, the magnetron 100 is capable of generating magnetic fields of different shapes and strengths by setting respective electromagnets 104 to be inactive, active with a positive polarity, or active with a negative polarity by controlling the current supplied to each electromagnet 104. Because magnetic conductive segments 134 of the magnetic conductive plate 108 can be inserted or removed from receptacles, the magnetic conductive plate can be configured in numerous ways. Thus, the magnetron 100 is versatile and easily reconfigurable to generate magnetic fields of different shapes and strengths over magnetrons that have permanently active magnets of fixed polarities at permanent locations.

The magnetron 100 is readily modifiable to generate electron charged magnetic fields 1340 of different shapes and strengths near the target material 1310. Because the magnetron 100 is readily modifiable, the deposition rate and uniformity of a deposition material formed over the surface of the substrate 1316 or other material is controllable during the PVD process. The electron charged magnetic field 1340 is modified by adjusting the current supplied to the electromagnets 104, rendering physical adjustments to the magnetron 100 or the deposition device 1300 unnecessary. In contrast, magnetrons that comprise permanent magnets are modifiable through an involved process that comprises physically removing the magnetron from the deposition chamber, removing permanent magnets, installing permanent magnets of different strengths and different polarities at different locations in the magnetron, and reinstalling the magnetron in the deposition chamber.

The electron charged magnetic field 1340 generated by the disclosed magnetron 100 is modifiable between different PVD process by adjusting the current supplied to the electromagnets 104, thereby shortening the event/redesign time between different PVD processes relative to the event/redesign time of permanent magnet magnetrons. The lifetime of the target material 1310 may be increased over target lifetimes of permanent magnet magnetrons because the electron charged magnetic field 1340 may be modified such that the ions are attracted to different areas of the target material 1310 over time.

According to some embodiments a magnetron for physical vapor deposition includes a magnetic conductive plate, a base coupled to the magnetic conductive plate, and a plurality of electromagnets disposed between the magnetic conductive plate and the base, wherein electromagnets of the plurality of electromagnets are coupled to the base.

According to some embodiments, a deposition device for physical vapor deposition includes a housing defining a deposition chamber, wherein the housing includes a side surface defining a gas port to introduce a gas into the deposition chamber. A substrate holder is disposed within the deposition chamber, wherein the substrate holder comprises a surface. A magnetron is disposed within the deposition chamber. The magnetron includes a magnetic conductive plate, a base, wherein the magnetic conductive plate is disposed between the base and the surface, and a plurality of electromagnets disposed between the magnetic conductive plate and the base.

According to some embodiments, a method of physical vapor deposition includes deactivating a first electromagnet of a plurality of electromagnets within a deposition chamber, generating a magnetic field between a positive pole of a second electromagnet and a negative pole of a third electromagnet within the deposition chamber, introducing an inert gas into the deposition chamber, and ionizing the inert gas to cause ions of the inert gas to impact a target deposition material within the magnetic field.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A magnetron for physical vapor deposition, comprising:
   a magnetic conductive plate defining a plurality of receptacles, wherein the magnetic conductive plate comprises magnetic conductive segments disposed within at least some receptacles of the plurality of receptacles;
   a base coupled to the magnetic conductive plate; and
   a plurality of electromagnets disposed between the magnetic conductive plate and the base in a first direction and spaced apart from the magnetic conductive plate in the first direction, wherein:
      the plurality of electromagnets are in direct contact with the base, and
      each electromagnet of the plurality of electromagnets comprises:
         a magnetic core;
         a coil surrounding the magnetic core, wherein the coil comprises a conductor; and
         an encapsulator encapsulating the magnetic core and the coil, wherein the encapsulator comprises a magnetic-isolated material.

2. The magnetron of claim 1, wherein the magnetic conductive plate comprises:
   side surfaces defining the plurality of receptacles.

3. The magnetron of claim 2 wherein some of the magnetic conductive segments disposed within some receptacles of the plurality of receptacles collectively define a polygonal shape.

4. The magnetron of claim 1, comprising a current regulator electrically coupled to one or more electromagnets of the plurality of electromagnets.

5. The magnetron of claim 4, comprising a programmer electrically coupled to the current regulator to activate at least one electromagnet of the plurality of electromagnets, and to concurrently deactivate at least one other electromagnet of the plurality of electromagnets.

6. A deposition device for physical vapor deposition, comprising:
   a housing defining a deposition chamber, wherein the housing comprises a side surface defining a gas port to introduce a gas into the deposition chamber;
   a holder disposed within the deposition chamber, wherein the holder comprises a surface; and
   a magnetron disposed within the deposition chamber, wherein the magnetron comprises:
      a magnetic conductive plate defining a plurality of receptacles, wherein the magnetic conductive plate comprises magnetic conductive segments disposed within at least some receptacles of the plurality of receptacles,
      a base, wherein the magnetic conductive plate is disposed between the base and the surface in a first direction, and
      a plurality of electromagnets in direct contact with the base, wherein the plurality of electromagnets are disposed between the magnetic conductive plate and the base in the first direction and spaced apart from the magnetic conductive plate, including the magnetic conductive segments, in the first direction,
   wherein each electromagnet of the plurality of electromagnets comprises:
      a magnetic core;
      a coil surrounding the magnetic core, wherein the coil comprises a conductor; and
      an encapsulator encapsulating the magnetic core and the coil, wherein the encapsulator comprises a magnetic-isolated material.

7. The deposition device of claim 6, wherein:
   the magnetic conductive plate comprises side surfaces defining the plurality of receptacles.

8. The deposition device of claim 7, wherein the side surfaces of the magnetic conductive plate define a pattern of triangular receptacles of the plurality of receptacles.

9. The deposition device of claim 7, wherein a first group of the magnetic conductive segments disposed within a first set of the plurality of receptacles collectively define a polygonal shape.

10. The deposition device of claim 6, comprising a target material disposed between the magnetron and the holder and spaced apart from the magnetic conductive plate.

11. The deposition device of claim 6, wherein:
    the base comprises side surfaces defining a plurality of conductor receptacles, and
    the conductor of each of the plurality of electromagnets passes through a corresponding conductor receptacle of the plurality of conductor receptacles.

12. The deposition device of claim 6, comprising a current regulator electrically coupled to one or more electromagnets of the plurality of electromagnets.

13. The deposition device of claim 12, comprising a programmer electrically coupled to the current regulator to activate at least one electromagnet of the plurality of electromagnets, and to concurrently deactivate at least one other electromagnet of the plurality of electromagnets.

14. The deposition device of claim 6, wherein:
    a first electromagnet of the plurality of electromagnets has a first polarity, and
    a second electromagnet of the plurality of electromagnets has a second polarity, opposite the first polarity.

15. A deposition device for physical vapor deposition, comprising:
    a magnetron comprising:
       a magnetic conductive plate defining a plurality of receptacles, wherein the magnetic conductive plate comprises magnetic conductive segments disposed within at least some receptacles of the plurality of receptacles; and
       a plurality of electromagnets overlying the magnetic conductive segments in a first direction and spaced apart from the magnetic conductive plate, wherein the plurality of electromagnets are in direct contact with a base of the magnetron; and
    a holder for supporting a substrate, wherein the magnetic conductive segments are between the plurality of electromagnets and the holder in the first direction,
    wherein each electromagnet of the plurality of electromagnets comprises:
       a magnetic core;
       a coil surrounding the magnetic core, wherein the coil comprises a conductor; and
       an encapsulator encapsulating the magnetic core and the coil, wherein the encapsulator comprises a magnetic-isolated material.

16. The deposition device of claim 15, wherein the magnetron further comprises:
    a magnetic conductive plate support extending between the base and the magnetic conductive plate.

17. The deposition device of claim 16, wherein the plurality of electromagnets are disposed between the magnetic conductive plate and the base in the first direction.

18. The deposition device of claim 15, wherein the magnetron further comprises a current regulator electrically coupled to one or more electromagnets of the plurality of electromagnets.

19. The deposition device of claim 16, wherein:
the base comprises side surfaces defining a plurality of conductor receptacles, and
the conductor of each of the plurality of electromagnets passes through a corresponding conductor receptacle of the plurality of conductor receptacles.

20. The magnetron of claim 1, wherein:
the base comprises side surfaces defining a plurality of conductor receptacles, and
the conductor of each of the plurality of electromagnets passes through a corresponding conductor receptacle of the plurality of conductor receptacles.

\* \* \* \* \*